(12) United States Patent
Chen et al.

(10) Patent No.: US 10,096,774 B2
(45) Date of Patent: Oct. 9, 2018

(54) EVAPORATION METHOD AND EVAPORATION DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Junsheng Chen, Beijing (CN); Cheng Li, Beijing (CN)

(73) Assignees: BOE Technology Group Co., Ltd., Beijing (CN); Ordos Yuansheng Optoelectronics Co., Ltd., Ordos, Inner Mongolia (CN)

(*) Notice: Subject to any disclaimer, the term of this patent is extended or adjusted under 35 U.S.C. 154(b) by 0 days.

(21) Appl. No.: 14/437,042

(22) PCT Filed: Jul. 25, 2014

(86) PCT No.: PCT/CN2014/083005
§ 371 (c)(1),
(2) Date: Apr. 20, 2015

(87) PCT Pub. No.: WO2015/043303
PCT Pub. Date: Apr. 2, 2015

(65) Prior Publication Data
US 2015/0287922 A1 Oct. 8, 2015

(30) Foreign Application Priority Data
Sep. 25, 2014 (CN) .......................... 2013 1 0449908

(51) Int. Cl.
H01L 51/00 (2006.01)
C23C 14/04 (2006.01)
(Continued)

(52) U.S. Cl.
CPC ........ *H01L 51/0011* (2013.01); *C23C 14/042* (2013.01); *C23C 14/12* (2013.01);
(Continued)

(58) Field of Classification Search
CPC ....... H01L 21/56; H01L 51/56; H01L 51/0011
See application file for complete search history.

(56) References Cited

U.S. PATENT DOCUMENTS

2006/0011136 A1  1/2006  Yamazaki et al.
2007/0290955 A1  12/2007  Tsujimura
(Continued)

FOREIGN PATENT DOCUMENTS

CN  1682569 A  10/2005
CN  1874629 A  12/2006
(Continued)

OTHER PUBLICATIONS

International Search Report dated Nov. 14, 2014 issued in corresponding International Application No. PCT/CN2014/083005.
(Continued)

*Primary Examiner* — Yu-Hsi D Sun
(74) *Attorney, Agent, or Firm* — Nath, Goldberg & Meyer; Joshua B. Goldberg

(57) ABSTRACT

The present invention discloses an evaporation method and an evaporation device. The evaporation method includes successively providing at least one mask above a base substrate and forming at least one evaporation sub-pattern on the base substrate by an evaporation process so that an evaporation pattern is formed on the base substrate, wherein the evaporation pattern is constituted by the at least one evaporation sub-pattern. As the evaporation pattern finally formed is constituted by the at least one evaporation sub-pattern, only a small number of opening regions are required to be formed on each of the masks used for forming the evaporation sub-patterns compared with the prior art, so that the widths of the shield regions between the adjacent opening regions may be set to be larger.

13 Claims, 16 Drawing Sheets

(51) Int. Cl.
*C23C 14/12* (2006.01)
*C23C 14/24* (2006.01)
*H01L 27/32* (2006.01)
*H01L 51/50* (2006.01)

(52) U.S. Cl.
CPC .......... *C23C 14/24* (2013.01); *H01L 27/3211* (2013.01); *H01L 51/5012* (2013.01); *H01L 51/5088* (2013.01)

(56) References Cited

U.S. PATENT DOCUMENTS

| | | | |
|---|---|---|---|
| 2009/0121983 | A1 | 5/2009 | Sung et al. |
| 2010/0084088 | A1 | 4/2010 | Nakadate |
| 2015/0287922 | A1* | 10/2015 | Chen .................... C23C 14/042 438/46 |

FOREIGN PATENT DOCUMENTS

| | | |
|---|---|---|
| CN | 202139291 U | 2/2012 |
| CN | 102800813 A | 11/2012 |
| CN | 102899609 A | 1/2013 |
| CN | 103484818 A | 1/2014 |
| JP | 05-108014 A | 4/1993 |
| KR | 20090017910 A | 2/2009 |
| WO | 2011/034011 A1 | 3/2011 |

OTHER PUBLICATIONS

Chinese Office Action dated Mar. 2, 2015 issued in corresponding Chinese Application No. 201310449908.6.

* cited by examiner

EVAPORATION METHOD AND EVAPORATION DEVICE

This is a National Phase Application filed under 35 U.S.C. 371 as a national stage of PCT/CN2014/083005, filed Jul. 25, 2014, an application claiming the benefit of Chinese Application No. 201310449908.6, filed Sep. 25, 2013, the content of each of which is hereby incorporated by reference in its entirety.

FIELD OF THE INVENTION

The present invention relates to the field of display technology, and particularly relates to an evaporation method and an evaporation device.

BACKGROUND OF THE INVENTION

Fine Metal Masks (simply referred to as FMMs) are commonly used in evaporation processes during the manufacturing processes of Organic Light-Emitting Diodes (simply referred to as OLEDs).

FIG. 1a is a partial plan view of a FMM in the prior art, and FIG. 1b is a section view of FIG. 1a, taken along an A-A direction. As shown in FIG. 1a and FIG. 1b, the FMM includes opening regions 1 and shielding regions 2. The opening regions 1 are used for forming any one of a red electroluminescent layer, a green electroluminescent layer and a blue electroluminescent layer, while the shielding regions 2 is used for shielding the other two electroluminescent layers. For example, in a case where the opening regions 1 are used for forming the red electroluminescent layer (Emission layer, EML for short), the shielding regions 2 correspond to positions where the green electroluminescent layer and the blue electroluminescent layer are located. The sectional shape, taken along the A-A direction, of the shielding region 2 is set to be isosceles trapezoid, and the width of the bottom surface of the isosceles trapezoid is $D1=b+2a=b+2d/\tan \theta$, so that the dot pitch $D=D1+D2\approx 1.5*D1=1.5(b+2d/\tan \theta)$, where $\theta$ is the slope angle of the opening region 1, b is the width of the upper surface of the isosceles trapezoid and is generally set to be a fixed value due to the limitations of process conditions, and d is the thickness of the FMM. On the other hand, the dot pitch D is three times as long as pixel pitch D', that is, $D=3*D'$, so that the width of shielding region $D1\approx 3*D1'/1.5=2*D'$ in the prior art. In such a case, the degree of $\theta$ affects the result of evaporation. However, $\theta$ is generally set to be 40 to 60 degrees and b is set to be a fixed value due to the limitations of process conditions, and therefore, if it is required to obtain a small pixel pitch D', the thickness d of the FMM is required to be small. As pixels per inch (PPI for short) is 8.47/D', if it is required to obtain a higher PPI, the pixel pitch D' is required to be small, that is to say, the thickness d of the FMM is required to be small. At present, however, the thickness of a metal sheet used for manufacturing a FMM is usually 40 μm, and 30 μm at minimum. Even if a FMM is manufactured by using the metal sheet with the minimum thickness, the pixel pitch D' thereof cannot meet the requirement of being small, and thus, the higher PPI cannot be obtained.

In the prior art, in a case where the electroluminescent layer of one color is manufactured, because only one FMM is used in evaporation process, all the opening regions used for forming all the patterns in the electroluminescent layer of the one color are required to be manufactured on the one FMM. Taking that a red electroluminescent layer is manufactured as an example, the red electroluminescent layer includes a plurality of red electroluminescent sub-patterns and thus the FMM is a red pattern mask 3. FIG. 1c is a schematic diagram illustrating the formation of the red electroluminescent layer in the prior art and FIG. 1d is a partial plan view of the red pattern mask 3 in the FIG. 1c. As shown in FIG. 1c and FIG. 1d, the red pattern mask 3 is provided above a base substrate 12, and then all of the red electroluminescent sub-patterns 4 are formed on the base substrate 12 by an evaporation process, so that the red electroluminescent layer is formed. The red pattern mask 3 is provided thereon with opening regions 5 used for forming the red electroluminescent sub-patterns 4. As all of the red electroluminescent sub-patterns 4 included in the red electroluminescent layer may be formed by using one red pattern mask 3 and by one evaporation process in the prior art, so that the red pattern mask 3 includes all of the opening regions 5 used for forming all of the red electroluminescent sub-patterns 4. Therefore, the widths of shielding regions 6 between opening regions 5 are required to be small. As the number of opening regions arranged on one FMM is large, the widths of the shielding regions between the opening regions are required to be small when a large number of the opening regions are manufactured, that is to say, the thickness of the FMM is required to be small.

In the current process level of the art, in a case where a thinner metal plate is used for manufacturing the above FMM, the widths of the opening regions cannot remain the same as each other, so that the distribution of the opening regions cannot be uniform, and the product yield is also decreased.

As described above, in the current process level of the art, the thickness of a FMM cannot be manufactured to be thinner (that is, the thickness cannot be smaller than 30 μm). Meanwhile, in order to ensure the product yield and to prevent the FMM from presenting non-uniform distribution of the opening regions, the thickness of a FMM cannot be manufactured to be thin. Therefore, in the current process level of the art, FMM is usually manufactured by using thick metal sheet, so that the PPI of product is decreased and the display definition of the product is also decreased.

SUMMARY OF THE INVENTION

The present invention provides an evaporation method and an evaporation device, which are used for increasing the PPI of product and increasing the display definition of the product.

To achieve the above objectives, the present invention provides an evaporation method, including:

successively providing at least one mask above a base substrate and forming at least one evaporation sub-pattern on the base substrate by an evaporation process, so that an evaporation pattern is formed on the base substrate, wherein the evaporation pattern is constituted by the at least one evaporation sub-pattern.

The evaporation pattern includes a predetermined number of the evaporation sub-patterns, each of the at least one mask is formed thereon with a specific number of opening regions, wherein the opening regions are used for forming the specific number of the evaporation sub-patterns of the predetermined number of the evaporation sub-patterns.

Optionally, the number of the at least one mask is more than one.

The step of successively providing at least one mask above a base substrate and forming at least one evaporation sub-pattern on the base substrate by an evaporation process includes:

successively providing each of the masks above the base substrate and forming a specific number of the evaporation sub-patterns on the base substrate by an evaporation process, so that a predetermined number of evaporation sub-patterns are formed on the base substrate.

Optionally, the predetermined number includes the product of the specific number and the number of the masks.

Optionally, the number of the masks is two or three.

Optionally, the number of the at least one mask is one.

The step of successively providing at least one mask above a base substrate and forming at least one evaporation sub-pattern on the base substrate by an evaporation process includes:

successively moving a mask or the base substrate so that the mask being successively located at one of different specific positions above the base substrate and forming a specific number of the evaporation sub-patterns on the base substrate by an evaporation process, so that a predetermined number of evaporation sub-patterns are formed on the base substrate.

Optionally, the predetermined number equals to the product of the specific number and the number of times of moving the mask or the base substrate.

Optionally, the evaporation pattern includes an electroluminescent layer or a hole injection layer.

Optionally, a fine metal mask is adopted as the mask.

To achieve the above objectives, the present invention provides an evaporation device including an evaporation source and a moving device, wherein the moving device is used for successively moving a mask or a base substrate so that the mask is successively located at one of different specific positions above the base substrate and at least one evaporation sub-pattern is formed on the base substrate by an evaporation process, so that an evaporation pattern constituted by the at least one evaporation sub-pattern is formed on the base substrate.

The beneficial effects of the present invention are as follow.

In the technical solutions of an evaporation method and an evaporation device provided by the present invention, at least one mask is successively provided above a base substrate and at least one evaporation sub-pattern is formed on the base substrate by an evaporation process, so that an evaporation pattern constituted by the at least one evaporation sub-pattern is formed on the base substrate. As the evaporation finally formed is constituted by the at least one evaporation sub-pattern, only a small number of opening regions are required to be formed on each of the masks used for forming the evaporation sub-patterns compared with the prior art, so that the widths of the shield regions between the adjacent opening regions may be set to be larger, that is to say, the thicknesses of the masks are not required to be thin. Further, for the present invention, the width of the shield region between the adjacent opening regions on one mask is not equal to but more than twice as long as the pixel pitch (for example, the width thereof is five times as long as the pixel pitch). Thus, the pixel pitch can be decreased by increasing the ratio of the width of the shield region between adjacent opening regions on one FMM to the pixel pitch, so that the PPI is increased correspondingly. Thus, the PPI of product will not be decreased even if a thick mask is used. Therefore, the problem of causing the PPI of product to be decreased by using a thick mask with a large number of opening regions in the prior art is avoided, so that the PPI of the product is increased and the display definition of the product is increased.

DETAILED DESCRIPTION OF THE EMBODIMENTS

Figure 1A:
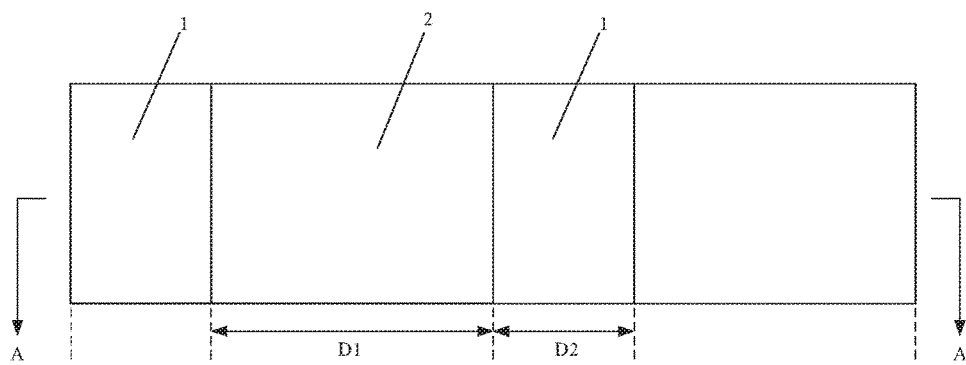
FIG. 1a is a partial plan view of a FMM in the prior art.
Figure 1B:
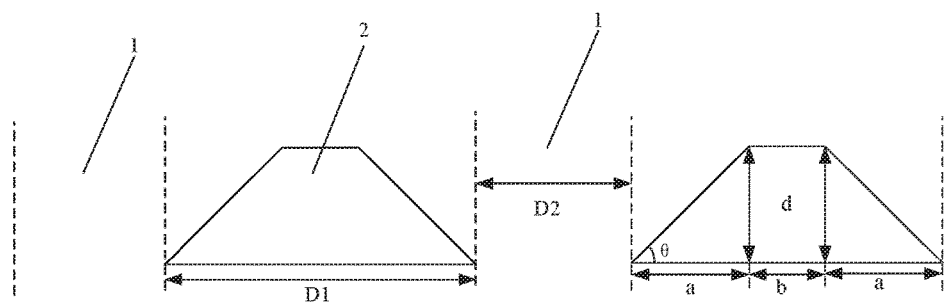
FIG. 1b is a section view of FIG. 1, taken along A-A direction.
Figure 1C:
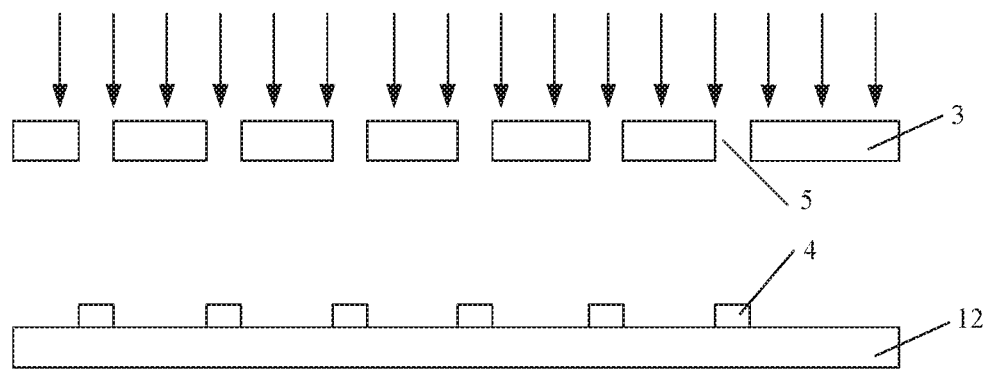
FIG. 1c is a schematic diagram illustrating a formation of a red electroluminescent layer in the prior art.

To make those skilled in the art better understand the technical solutions of the present invention, an evaporation method and an evaporation device provided by the present invention will be described in details in connection with the accompanying drawings.

Embodiment 1 of the present invention provides an evaporation method, including: successively providing at least one mask above a base substrate and forming at least one evaporation sub-pattern on the base substrate by an evaporation process, so that an evaporation pattern is formed on the base substrate, wherein the evaporation pattern is constituted by the at least one evaporation sub-pattern.

In Embodiment 1 of the present invention, the evaporation pattern may include a electroluminescent layer or a hole injection layer.

In Embodiment 1 of the present invention, a FMM may be adopted as the mask.

In Embodiment 1 of the present invention, some of the evaporation sub-patterns are formed on the base substrate every time the evaporation process is finished, and a predetermined number of evaporation sub-patterns (all of the evaporation sub-patterns constituting the evaporation pattern) are formed on the base substrate after a plurality of the evaporation processes, so that an evaporation pattern is formed on the base substrate.

A specific number of opening regions may be formed on one mask, wherein the specific number of the opening regions are used for forming the specific number of the evaporation sub-patterns of the predetermined number of the evaporation sub-patterns, and the sum of the opening regions formed on the respective masks equals to the predetermined number. Thus, compared with the prior art, only a small number of open regions are required to be formed on one mask, so that the width of the shield region between adjacent opening regions can be set to be larger (the width thereof is depending on the number of the opening regions required to be formed on one mask, and the more the number of the formed opening regions is, the wider the width thereof is), and also the thickness of the mask is not required to be thin. Further, for the Embodiment 1, the width of the shield region between the adjacent opening regions on one mask is not equal to but more than twice as long as the pixel pitch (for example, the width thereof is five times as long as the pixel pitch). Thus, the pixel pitch can be decreased by increasing the ratio of the width of the shield region between adjacent opening regions on one FMM to the pixel pitch, so that the PPI is increased correspondingly. Thus, the PPI of product will not be decreased even if a thick mask is used. Therefore, the problem of causing the PPI of product decreased by using a thick mask with a large number of opening regions formed thereon in the prior art is avoided, so that the PPI of the product is increased and the display definition of the product is increased.

The technical solution of the present will be described in details in connection with a specific Embodiment 2. In Embodiment 2, the successively providing at least one mask above a base substrate and forming at least one evaporation sub-pattern on the base substrate by an evaporation process may include: successively providing the at least one mask above the base substrate and forming a specific number of the evaporation sub-patterns on the base substrate by an evaporation process, so that a predetermined number (i.e. at least one) of evaporation sub-patterns are formed on the base substrate. The number of the masks may be more than one, and preferably, the number of the masks is two or three. In Embodiment 2, an example in which the number of the masks is two, the evaporation pattern includes an electroluminescent layer, the evaporation sub-patterns include electroluminescent sub-patterns and the electroluminescent layer include a predetermined number of the electroluminescent sub-patterns will be described. In Embodiment 2, the electroluminescent layer may include a red electroluminescent layer, a green electroluminescent layer or a blue electroluminescent layer, and correspondingly, the electroluminescent sub-pattern may include a red electroluminescent sub-pattern, a green electroluminescent sub-pattern or a blue electroluminescent sub-pattern. In Embodiment 2, a red electroluminescent layer, a green electroluminescent layer and a blue electroluminescent layer are successively formed on the base substrate, the number of the masks used for forming the electroluminescent layer of one color is two and the positions of the opening regions on respective masks are different. For example, two red pattern masks are required to form a red electroluminescent layer, two green pattern masks are required to form a green electroluminescent layer and two blue pattern masks are required to form a blue electroluminescent layer.

Figure 2A:
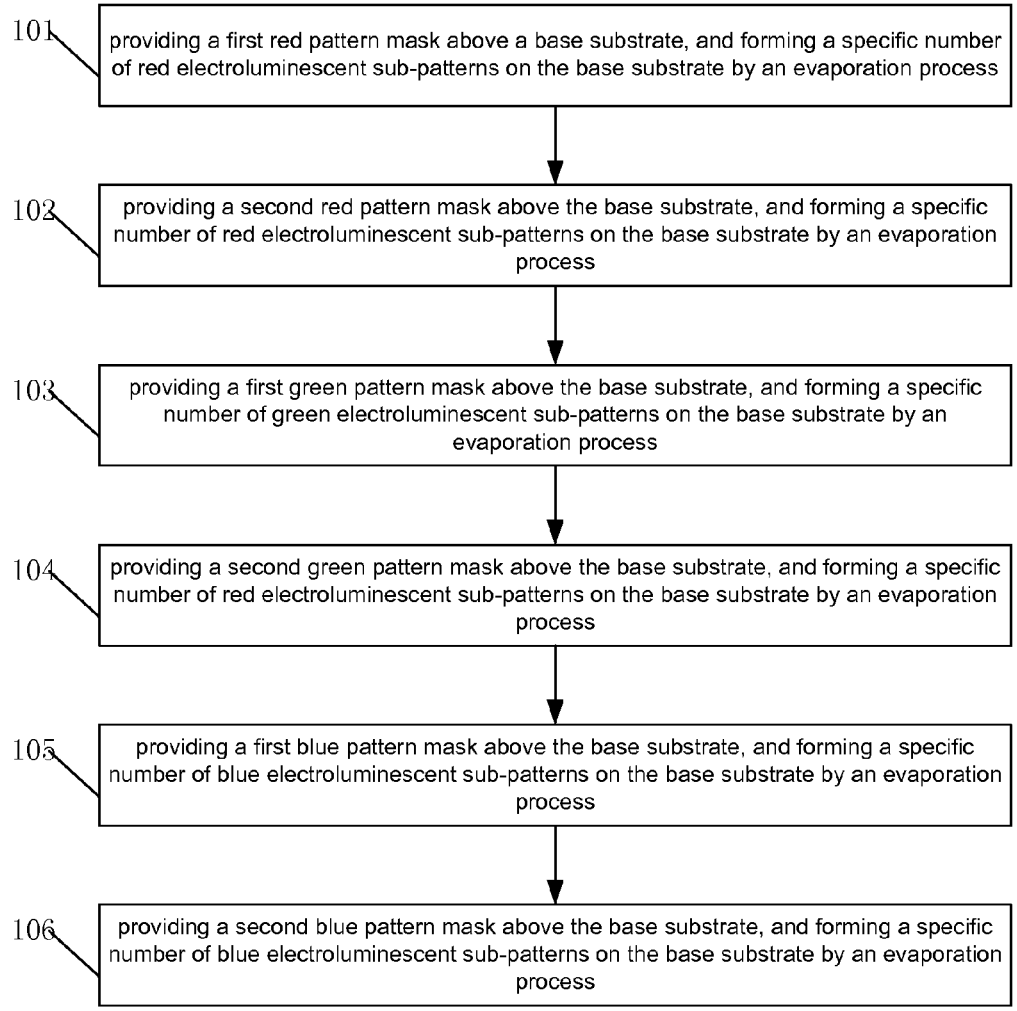
FIG. 2a is a flowchart of an evaporation method provided by Embodiment 2 of the present invention.

FIG. 2a is a flow chart of an evaporation method provided by Embodiment 2 of the present invention, and as shown in FIG. 2a, the method includes:

Step 101, providing a first red pattern mask above a base substrate, and forming a specific number of red electroluminescent sub-patterns on the base substrate by an evaporation process.

Figure 2B:
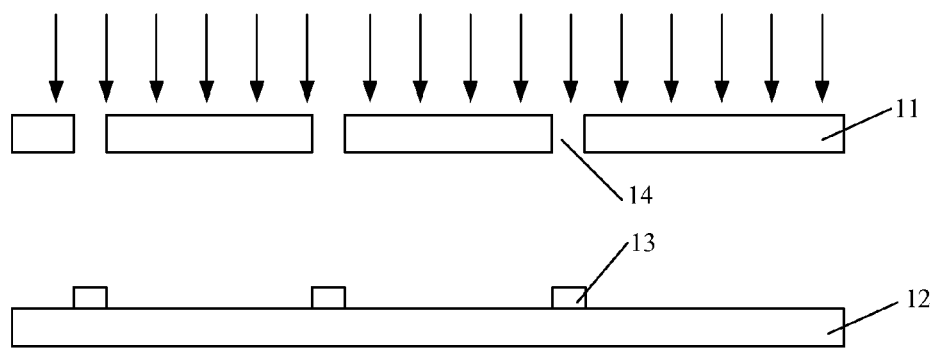
FIG. 2b is a schematic diagram illustrating an evaporation process performed by using a first red pattern mask.
Figure 2C:
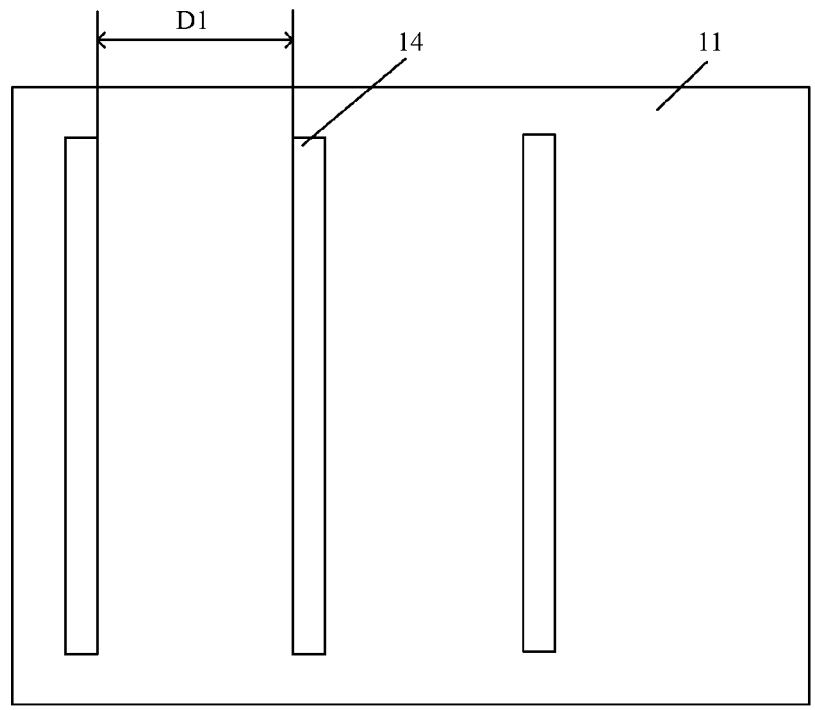
FIG. 2c is a plan view of the first red pattern mask of FIG. 2b.

FIG. 2b is a schematic diagram illustrating an evaporation process performed by using the first red pattern mask, and FIG. 2c is a plan view of the first red pattern mask of the FIG. 2b. As shown in FIG. 2b and FIG. 2c, a first red pattern mask 11 is provided above a base substrate 12, and a specific number of red electroluminescent sub-patterns 13 are formed on the base substrate 12 by an evaporation process. The first red pattern mask 11 are provided thereon with the specific number of opening regions 14, which are used for forming the specific number of the red electroluminescent sub-patterns 13. It is noted that only three opening regions 14 are present in the drawing as an example, however, those skilled in the art should understand that the actual number of the opening regions 14 is not limited thereto.

Step 102, providing a second red pattern mask above the base substrate, and forming a specific number of red electroluminescent sub-patterns on the base substrate by an evaporation process.

Figure 2D:
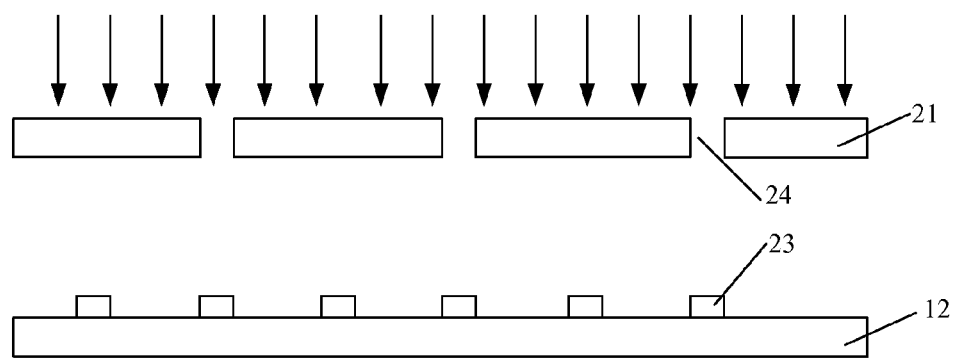
FIG. 2d is a schematic diagram illustrating an evaporation process performed by using a second red pattern mask.
Figure 2E:
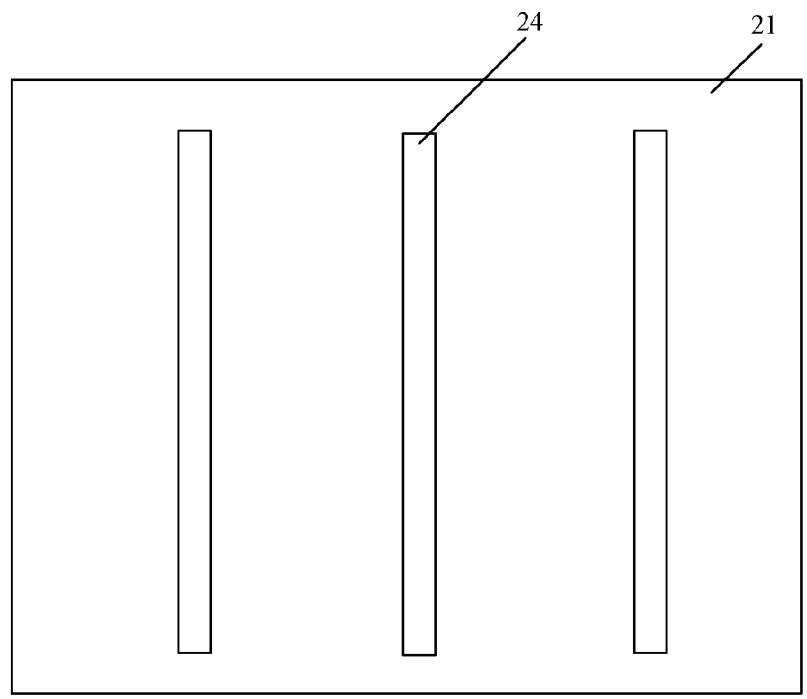
FIG. 2e is a plan view of the second red pattern mask of FIG. 2d.

FIG. 2d is a schematic diagram illustrating an evaporation process performed by using the second red pattern mask, and FIG. 2e is a plan view of the second red pattern mask of the FIG. 2d. As shown in FIG. 2d and FIG. 2e, a second red pattern mask 21 is provided above the base substrate 12, and a specific number of red electroluminescent sub-patterns 23 are formed on the base substrate 12 by an evaporation process. The second red pattern mask 21 are provided thereon with the specific number of opening regions 24, which are used for forming the specific number of the red electroluminescent sub-patterns 23. The positions of the opening regions on the second red pattern mask 21 are different from those of the first red pattern mask 11. As shown in FIG. 2b and FIG. 2d, for example, the positions of the respective opening regions on the second red pattern mask 21 are successively staggered with respect to the positions of the respective opening regions on the first red pattern mask 11. It is noted that only three opening regions 24 are present in the drawing as an example, however, those skilled in the art should understand that the actual number of the opening regions 24 is not limited thereto.

By performing steps 101 and 102, a red electroluminescent layer is formed on the base substrate 12, and the red electroluminescent layer includes the specific number of the red electroluminescent sub-patterns formed in step 101 and the specific number of the red electroluminescent sub-patterns formed in step 102, so that a predetermined number of the red electroluminescent sub-patterns are formed on the base substrate 12, that is to say, the red electroluminescent layer is formed on the base substrate 12. In Embodiment 2, preferably, the number of the opening regions on each of the red pattern masks is the same, so that the predetermined number equals to the product of the specific number and the number of the red pattern masks. In Embodiment 2, the predetermined number equals to the specific number multiplied by two. In actual practices, the number of the opening regions on each of the red pattern masks may be different, and in such a case, the predetermined number equals to the sum of the number of the opening regions on each of the red pattern masks.

Step 103, providing a first green pattern mask above the base substrate, and forming a specific number of green electroluminescent sub-patterns on the base substrate by an evaporation process.

Figure 2F:
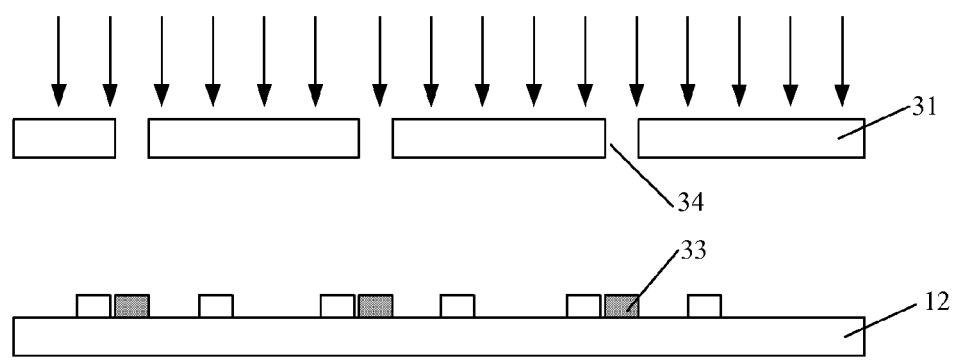
FIG. 2f is a schematic diagram illustrating an evaporation process performed by using a first green pattern mask.
Figure 2G:
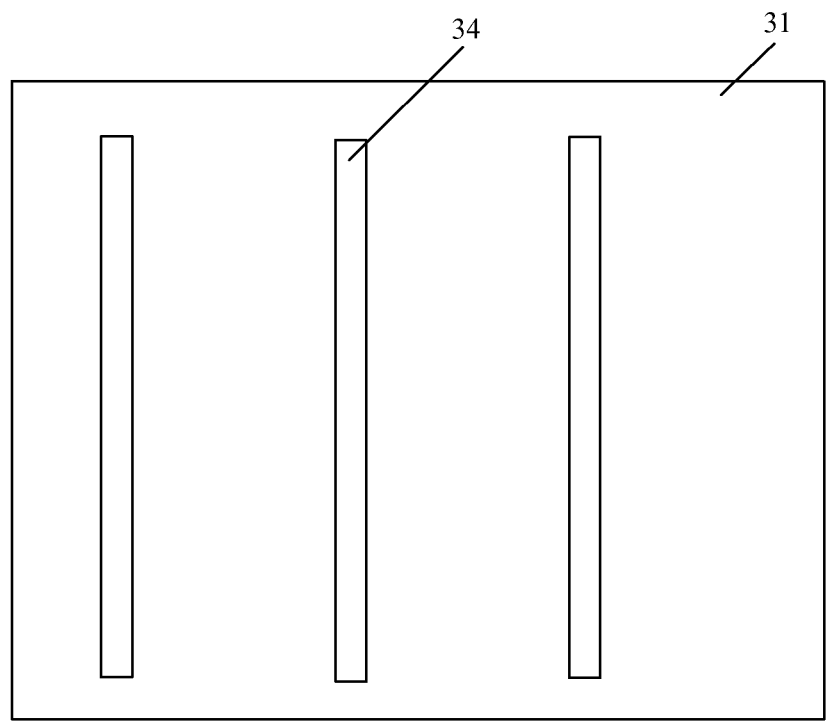
FIG. 2g is a plan view of the first green pattern mask of FIG. 2f.

FIG. 2f is a schematic diagram illustrating an evaporation process performed by using the first green pattern mask, and FIG. 2g is a plan view of the first green pattern mask of the FIG. 2f. As shown in FIG. 2f and FIG. 2g, a first green pattern mask 31 is provided above the base substrate 12, and a specific number of green electroluminescent sub-patterns 33 are formed on the base substrate 12 by an evaporation process. The first green pattern mask 31 is provided thereon with the specific number of opening regions 34, which are used for forming the specific number of the green electroluminescent sub-patterns 33. It is noted that only three opening regions 34 are present in the drawing as an example, however, those skilled in the art should understand that the actual number of the opening regions 34 is not limited thereto.

Step 104, providing a second green pattern mask above the base substrate, and forming a specific number of red electroluminescent sub-patterns on the base substrate by an evaporation process.

Figure 2H:
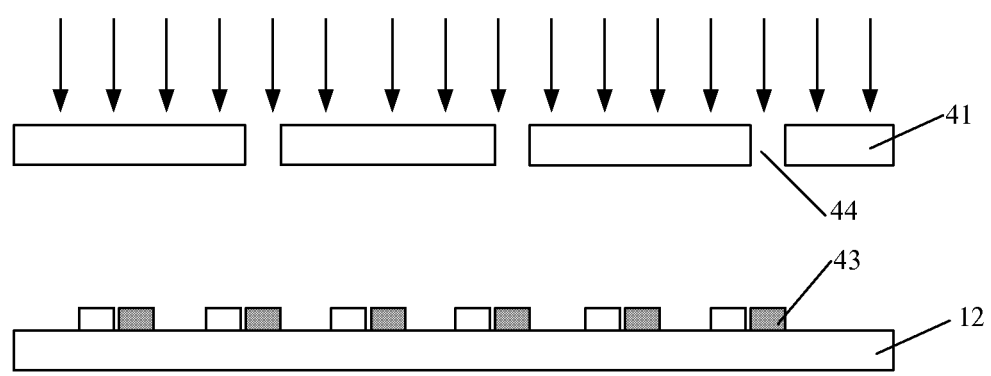
FIG. 2h is a schematic diagram illustrating an evaporation process performed by using a second green pattern mask.
Figure 2I:
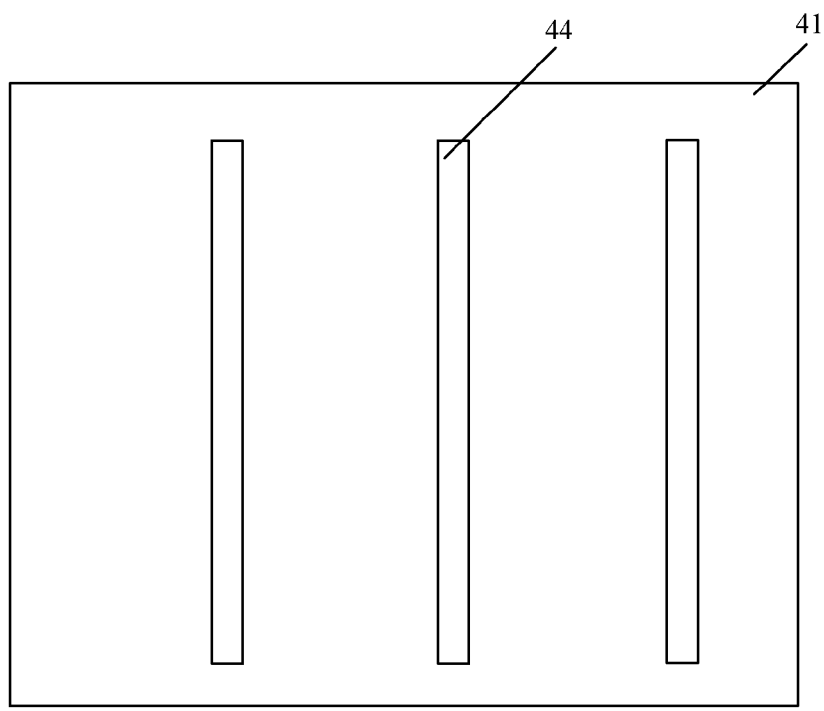
FIG. 2i is a plan view of the second green pattern mask of FIG. 2h.

FIG. 2h is a schematic diagram illustrating an evaporation process performed by using the second green pattern mask, and FIG. 2i is a plan view of the second green pattern mask of the FIG. 2h. As shown in FIG. 2h and FIG. 2i, a second green pattern mask 41 is provided above the base substrate 12, and a specific number of green electroluminescent sub-patterns 43 are formed on the base substrate 12 by an evaporation process. The second green pattern mask 41 is provided thereon with the specific number of opening regions 44, which are used for forming the specific number of the green electroluminescent sub-patterns 43. The positions of the opening regions on the second green pattern mask 41 are different from those of the first green pattern mask 31. As shown in FIG. 2f and FIG. 2h, for example, the positions of the respective opening regions on the second green pattern mask 41 are successively staggered with respect to the positions of the respective opening regions on the first green pattern mask 31. It is noted that only three opening regions 44 are present in the drawing as an example, however, those skilled in the art should understand that the actual number of the opening regions 44 is not limited thereto.

By performing steps 103 and 104, a green electroluminescent layer is formed on the base substrate 12, and the green electroluminescent layer includes the specific number of the green electroluminescent sub-patterns formed in step 103 and the specific number of the green electroluminescent sub-patterns formed in step 104, so that a predetermined number of the green electroluminescent sub-patterns are formed on the base substrate 12, that is to say, the green electroluminescent layer is formed on the base substrate 12. In Embodiment 2, preferably, the number of the opening regions on each of the green pattern masks is the same, so that the predetermined number equals to the product of the specific number and the number of the green pattern masks. In Embodiment 2, the predetermined number equals to the specific number multiplied by two. In actual practices, the number of the opening regions on each of the green pattern masks may be different, and in such a case, the predetermined number equals to the sum of the number of the opening regions on each of the green pattern masks.

Step 105, providing a first blue pattern mask above the base substrate, and forming a specific number of blue electroluminescent sub-patterns on the base substrate by an evaporation process.

Figure 2J:
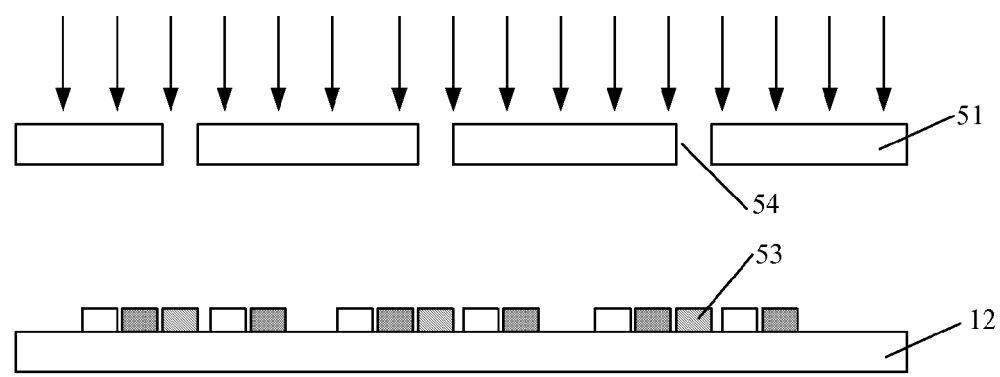
FIG. 2j is a schematic diagram illustrating an evaporation process performed by using a first blue pattern mask.
Figure 2K:
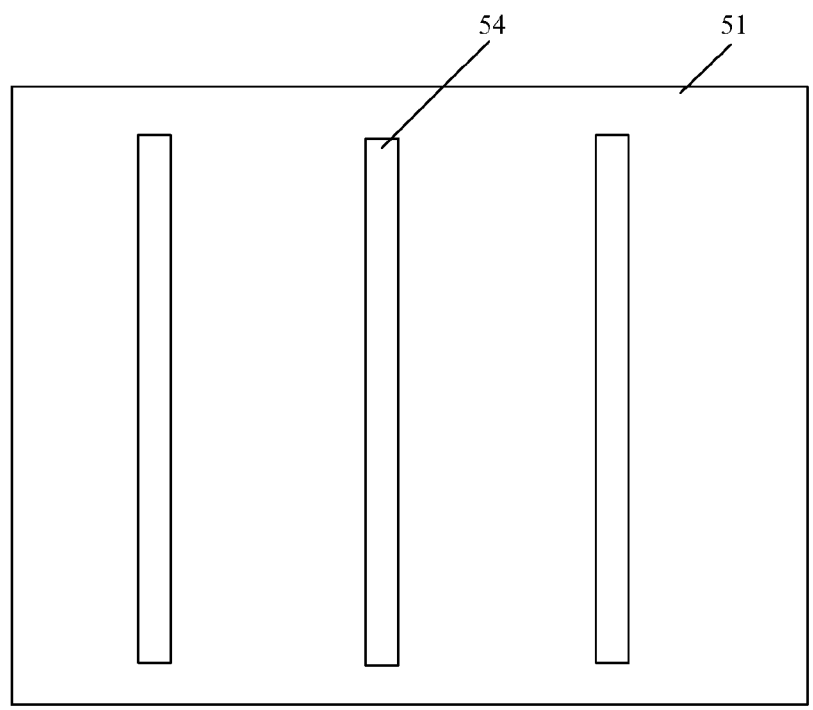
FIG. 2k is a plan view of the first blue pattern mask of FIG. 2j.

FIG. 2j is a schematic diagram illustrating an evaporation process performed by using the first blue pattern mask, and FIG. 2k is a plan view of the first blue pattern mask of the FIG. 2j. As shown in FIG. 2j and FIG. 2k, a first blue pattern mask 51 is provided above the base substrate 12, and a specific number of blue electroluminescent sub-patterns 53 are formed on the base substrate 12 by an evaporation process. The first blue pattern mask 51 is provided thereon with the specific number of opening regions 54, which are used for forming the specific number of the blue electroluminescent sub-patterns 53. It is noted that only three opening regions 54 are present in the drawing as an example, however, those skilled in the art should understand that the actual number of the opening regions 54 is not limited thereto.

Step 106, providing a second blue pattern mask above the base substrate, and forming a specific number of blue electroluminescent sub-patterns on the base substrate by an evaporation process.

Figure 2L:
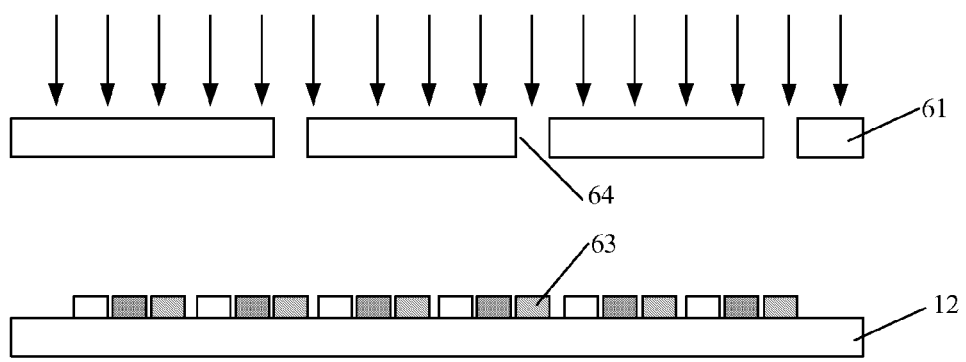
FIG. 2l is a schematic diagram illustrating an evaporation process performed by using a second blue pattern mask.
Figure 2M:
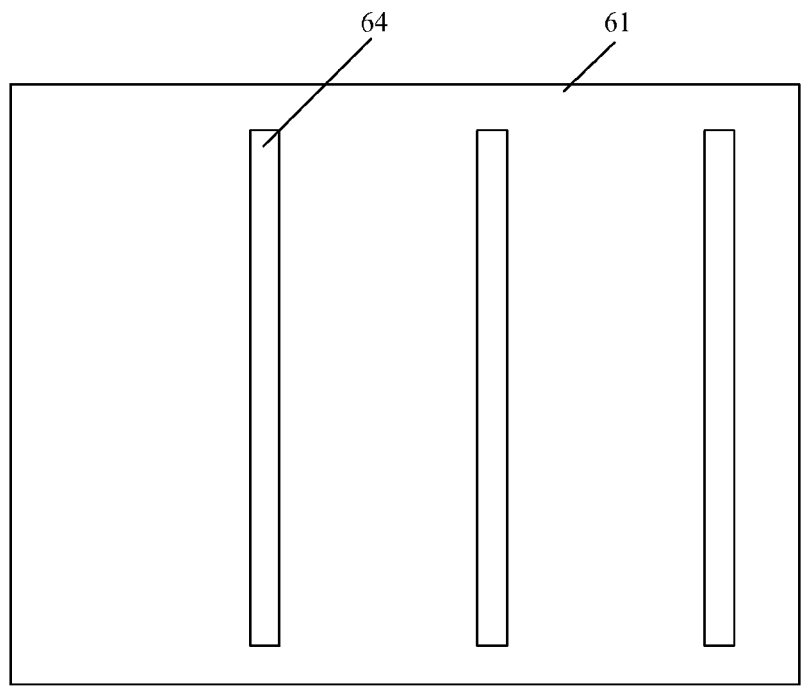
FIG. 2m is a plan view of the second blue pattern mask of FIG. 2l.

FIG. 2l is a schematic diagram illustrating an evaporation process performed by using the second blue pattern mask, and FIG. 2m is a plan view of the second blue pattern mask of the FIG. 2l. As shown in FIG. 2l and FIG. 2m, a second blue pattern mask 61 is provided above the base substrate 12, and a specific number of blue electroluminescent sub-patterns 63 are formed on the base substrate 12 by an evaporation process. The second blue pattern mask 61 is provided thereon with the specific number of opening regions 64, which are used for forming the specific number of the blue electroluminescent sub-patterns 63. The positions of the opening regions on the second blue pattern mask 61 are different from those of the first blue pattern mask 51. As shown in FIG. 2j and FIG. 2l, for example, the positions of the respective opening regions on the second blue pattern mask 61 are successively staggered with respect to the positions of the respective opening regions on the first red pattern mask 51. It is noted that only three opening regions 64 are present in the drawing as an example, however, those skilled in the art should understand that the actual number of the opening regions 64 is not limited thereto.

By performing steps 105 and 106, a blue electroluminescent layer is formed on the base substrate 12, and the blue electroluminescent layer includes the specific number of the blue electroluminescent sub-patterns formed in step 105 and the specific number of the blue electroluminescent sub-patterns formed in step 106, so that a predetermined number of the blue electroluminescent sub-patterns are formed on the base substrate 12, that is to say, the blue electroluminescent layer is formed on the base substrate 12. In Embodiment 2, preferably, the number of the opening regions on each of the blue pattern masks is the same, so that the predetermined number equals to the product of the specific number and the number of the blue pattern masks. In Embodiment 2, the predetermined number equals to the specific number multiplied by two. In actual practices, the number of the opening regions on each of the blue pattern masks may be different, and in such a case, the predetermined number equals to the sum of the number of the opening regions on each of the blue pattern masks.

Figure 2N:
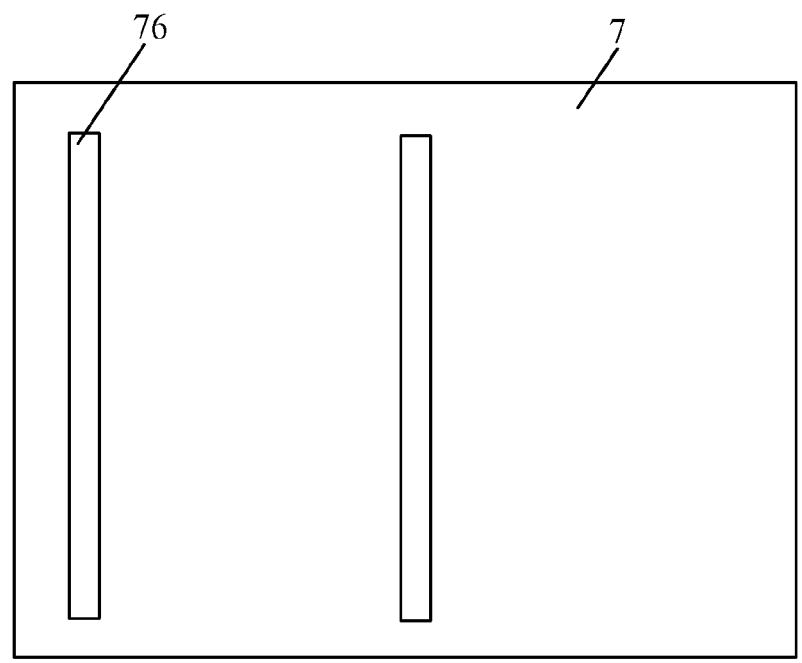
FIG. 2n is a plan view of a red pattern mask 7.
Figure 2O:
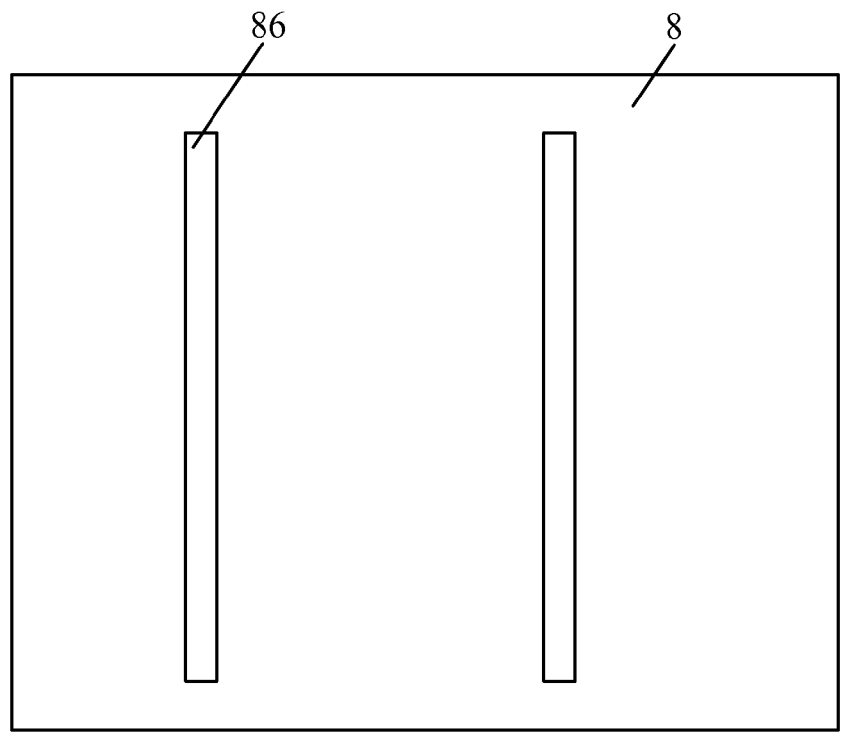
FIG. 2o is a plan view of a red pattern mask 8.
Figure 2P:
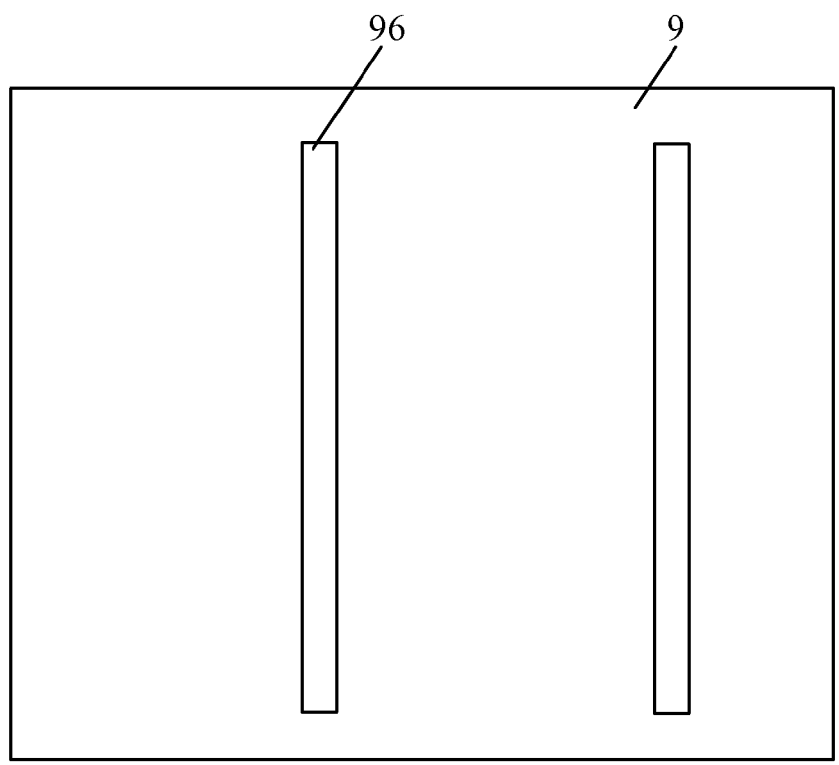
FIG. 2p is a plan view of a red pattern mask 9.

In actual practices, an evaporation pattern may be formed by another number of masks, for example, by three masks. Next, taking that a red electroluminescent layer is formed as an example, three red pattern masks are required to be used for forming the red electroluminescent layer, the three red pattern masks are a red pattern mask 7, a red pattern mask 8 and a red pattern mask 9, respectively. FIG. 2n is a plan view of the red pattern mask 8, FIG. 2o is a plan view of the red pattern mask 8 and FIG. 2p is a plan view of the red pattern mask 9. As shown in FIG. 2n, FIG. 2o and FIG. 2p, The red pattern mask 7 is provided thereon with a specific number of opening regions 76, the red pattern mask 8 is provided thereon with a specific number of opening regions 86 and the red pattern mask 9 is provided thereon with a specific number of opening regions 96, and the positions of the respective opening regions 76, the respective opening regions 86 and the respective opening regions 96 are different. In such a case, the evaporation processes performed by using the above three red pattern masks specifically include: providing the red pattern mask 7 above a base substrate, and forming a specific number of red electroluminescent sub-patterns corresponding to the specific number of the opening regions 76 on the base substrate by an evaporation process; providing the red pattern mask 8 above the base substrate, and forming a specific number of red electroluminescent sub-patterns corresponding to the specific number of the opening regions 86 on the base substrate by an evaporation process; and providing the red pattern mask 9 above the base substrate, and forming a specific number of red electroluminescent sub-patterns corresponding to the specific number of the opening regions 96 on the base substrate by an evaporation process, so that a predetermined number of red electroluminescent sub-patterns are formed on the base substrate, that is to say, the red electroluminescent layer as shown in FIG. 2d is formed on the base substrate. In this example, the schematic diagrams of the evaporation processes performed by using each of the red pattern masks will not be specifically presented herein.

Figure 1D:
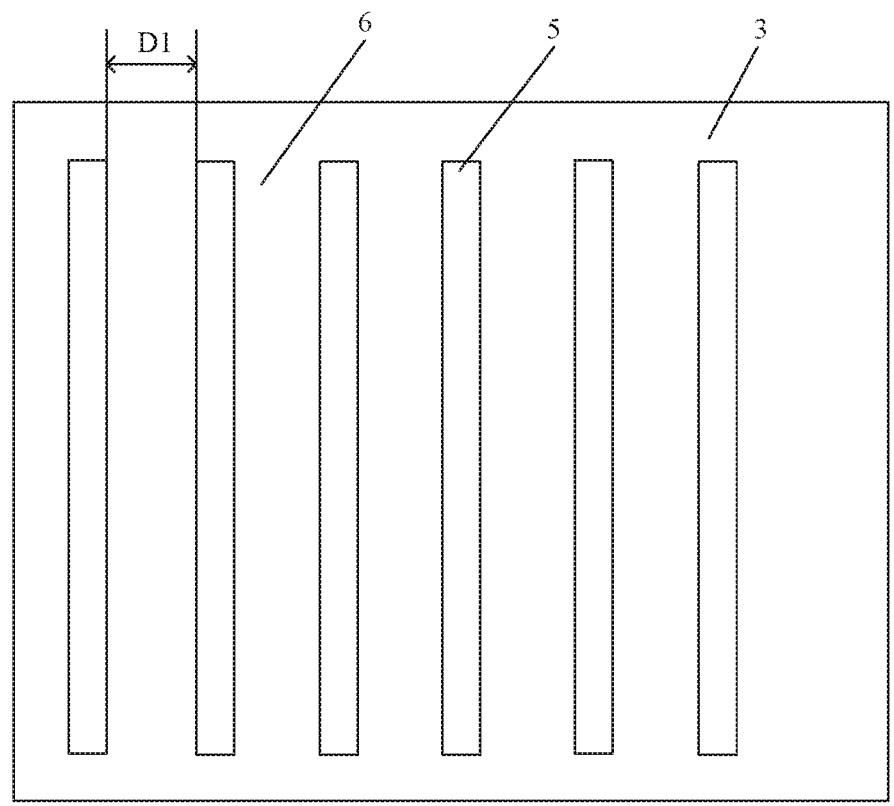
FIG. 1d is a partial plan view of a red pattern mask of FIG. 1c.

As shown in FIG. 2c, in the structure of the first red pattern mask 11 of the Embodiment 2, the width of the shield region D1≈5*D'. As shown in FIG. 1d, in the red pattern mask 3 in the prior art, the width of the shield region D1≈2*D'. It can be seen that in Embodiment 2, as compared with the prior art, the width of the shield region of the red pattern mask may be set to be larger due to the smaller number of the opening regions formed on the red pattern mask. Similarly, in Embodiment 2, in the structures of the second red pattern mask, two of the green pattern masks and two of the blue pattern masks, the widths of the shield regions thereof may be set to be larger, as compared with the prior art. In summary, as compared with the prior art, only a small number of opening regions are required to be formed on one mask, so that the widths of the shield regions between adjacent opening regions can be set to be larger and that the widths of the masks are not required to be thin. Further, in Embodiment 2, the width of the shield region D1≈5*D', the pixel pitch D' may be smaller as compared with the prior art in which the width of the shield region D1≈2*D', so that the PPI is increased correspondingly. Thus, in Embodiment 2, the PPI will not be decreased even if a thick mask is used. Therefore, the problem of causing the PPI of product to be decreased by using a thick mask with a large number of opening regions in the prior art is avoided, so that the PPI of the product is increased and the display definition of the product is increased.

Next, the technical solution of the present invention will be described in details in connection with a specific Embodiment 3. In Embodiment 3, the successively providing at least one mask above a base substrate and forming at least one evaporation sub-pattern on the base substrate by an evaporation process may include: successively moving the mask or the base substrate so that the mask successively is successively located at one of different specific positions above the base substrate, and forming the at least one evaporation sub-pattern on the base substrate by an evaporation process, so that an evaporation pattern constituted by the at least one evaporation sub-pattern is formed on the base substrate. Preferably, the number of the mask may be one. In Embodiment 3, an example in which the mask is moved, the number of the mask is one, the evaporation pattern includes a electroluminescent layer, the evaporation sub-pattern include electroluminescent sub-patterns and the electroluminescent layer includes a predetermined number (i.e. at least one) of the electroluminescent sub-patterns will be described. In Embodiment 3, the electroluminescent layer includes a red electroluminescent layer, a green electroluminescent layer or a blue electroluminescent layer, and correspondingly, the electroluminescent sub-pattern includes a red electroluminescent sub-pattern, a green electroluminescent sub-pattern or a blue electroluminescent sub-pattern. In embodiment 3, the red electroluminescent layer, the green electroluminescent layer and the blue electroluminescent layer are successively formed on the base substrate, and the number of the masks used for forming the electroluminescent layer of one color is one. For example, one red pattern mask is required to form the red electroluminescent layer, one green pattern mask is required to form the green electroluminescent layer and one blue pattern mask is required to form the blue electroluminescent layer.

Figure 3A:
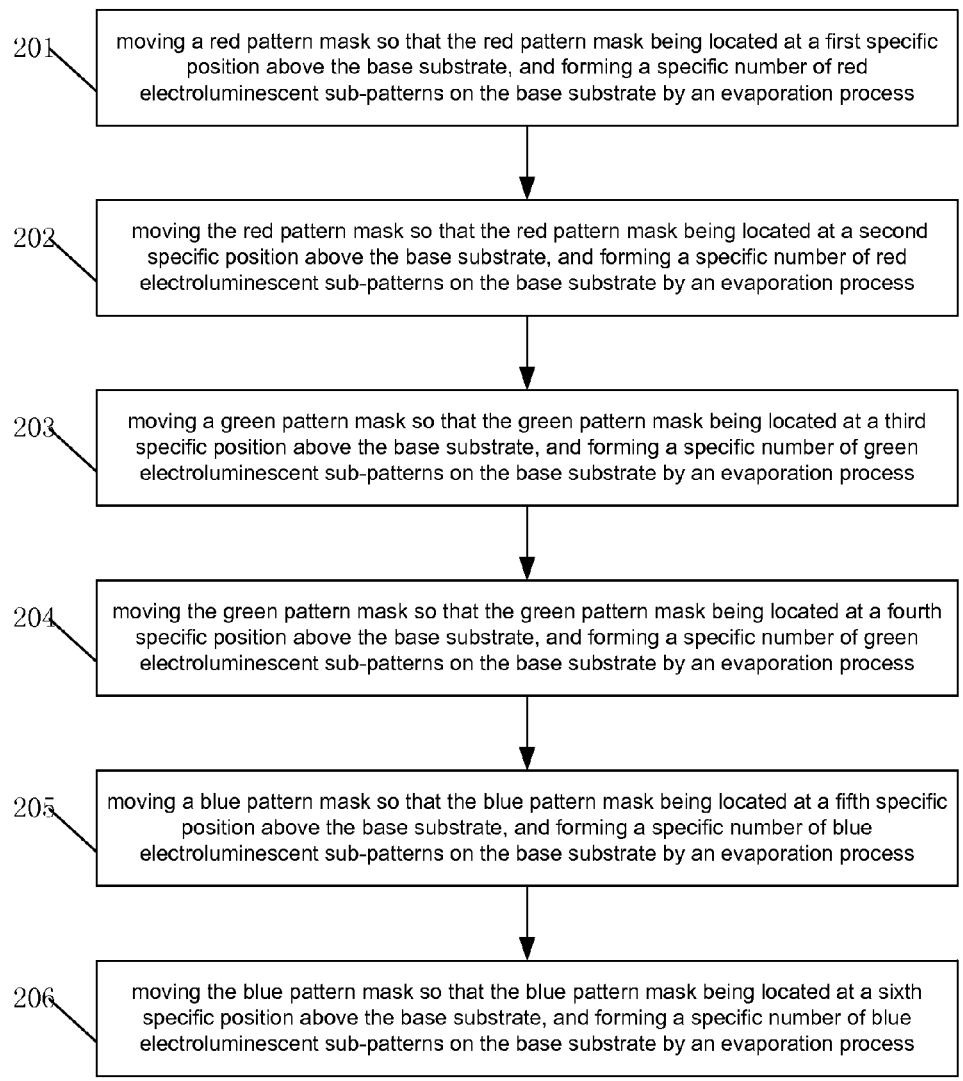
FIG. 3a is a flow chart of an evaporation method provided by Embodiment 3 of the present invention.

FIG. 3a is a flow chart of an evaporation method provided by Embodiment 3 of the present invention, as shown in FIG. 3a, the method includes:

Step 201, moving a red pattern mask so that the red pattern mask being located at a first specific position above the base substrate, and forming a specific number of red electroluminescent sub-patterns on the base substrate by an evaporation process.

Figure 3B:
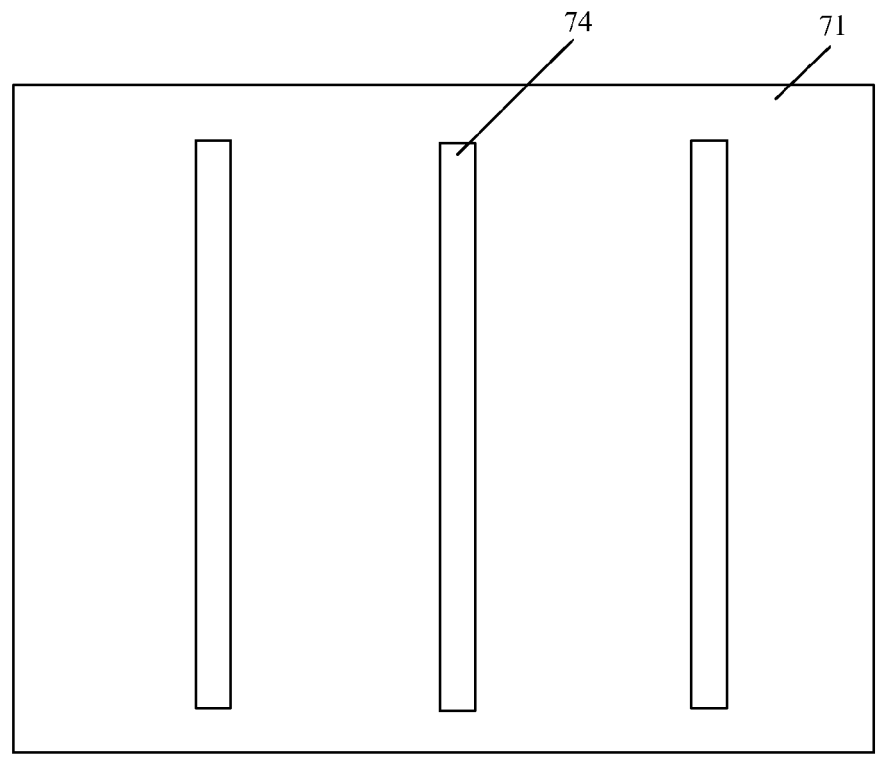
FIG. 3b is a plan view of a red pattern mask.
Figure 3C:
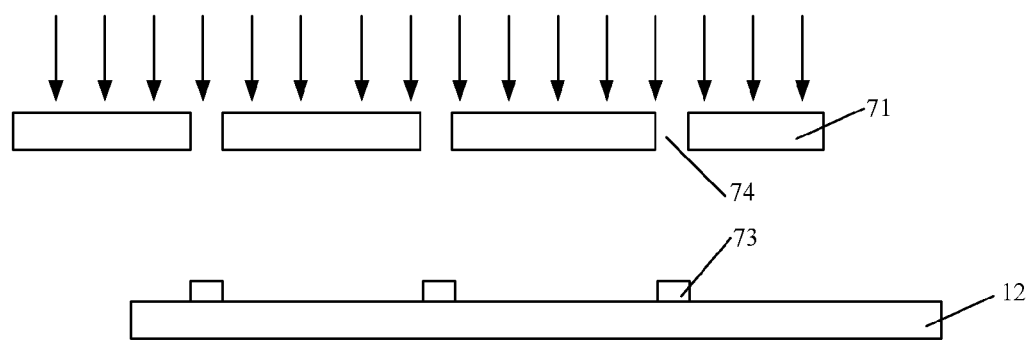
FIG. 3c is a schematic diagram illustrating a first evaporation process performed by using a red pattern mask.

FIG. 3b is a plan view of the red pattern mask, and FIG. 3c is a schematic diagram illustrating a first evaporation process performed by using the red pattern mask. As shown in FIG. 3b and FIG. 3c, a red pattern mask 71 is moved to a first specific position above a base substrate 12, and a specific number of red electroluminescent sub-patterns 73 are formed on the base substrate 12 by an evaporation process. The red pattern mask 71 is provided thereon with the specific number of opening regions 74. When the red pattern mask 71 is moved to the first specific position above the base substrate 12, the specific number of red electroluminescent sub-patterns 73 are formed. It is noted that only three opening regions 74 are present in the drawing as an example, however, those skilled in the art should understand that the actual number of the opening regions 74 is not limited thereto.

Step 202, moving the red pattern mask so that the red pattern mask being located at a second specific position above the base substrate, and forming a specific number of red electroluminescent sub-patterns on the base substrate by an evaporation process.

Figure 3D:
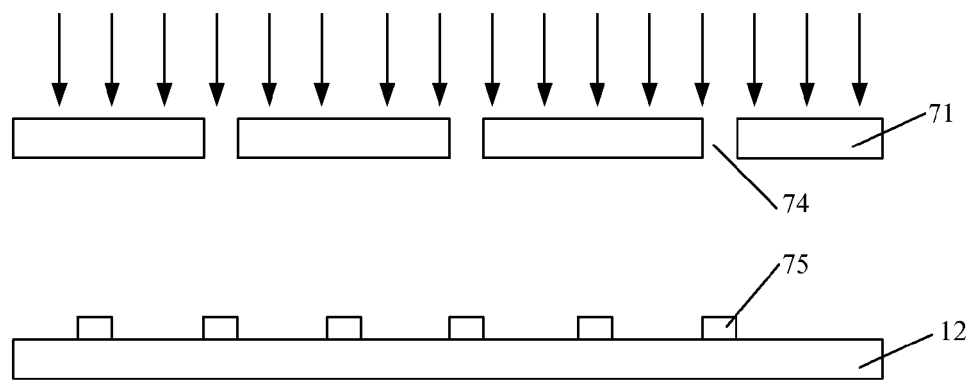
FIG. 3d is a schematic diagram illustrating a second evaporation process performed by using a red pattern mask.

FIG. 3d is a schematic diagram illustrating a second evaporation process performed by using the red pattern mask. As shown in FIG. 3b and FIG. 3d, the red pattern mask 71 is moved to a second specific position above the base substrate 12, and a specific number of red electroluminescent sub-patterns 75 are formed on the base substrate 12 by an evaporation process. The red pattern mask 71 is provided thereon with the specific number of opening regions 74. When the red pattern mask 71 is moved to the second specific position above the base substrate 12, the specific number of red electroluminescent sub-patterns 75 are formed. Of course, the first specific position in FIG. 3c is different from the second specific position in FIG. 3d. It is noted that only three opening regions 74 are present in the drawing as an example, however, those skilled in the art should understand that the actual number of the opening regions 74 is not limited thereto.

By performing steps 201 and 202, a red electroluminescent layer is formed on the base substrate 12, and the red electroluminescent layer includes the specific number of the red electroluminescent sub-patterns formed in step 201 and the specific number of the red electroluminescent sub-patterns formed in step 202, so that a predetermined number of the red electroluminescent sub-patterns are formed on the base substrate 12. In Embodiment 3, the predetermined number equals to the product of the specific number and the number of times of moving the red pattern mask, wherein the number of times of moving the red pattern mask (i.e. the times of masking) equals to the number of times of performing evaporation processes by using the red pattern mask. In Embodiment 3, the predetermined number equals to the specific number multiplied by two.

Step 203, moving a green pattern mask so that the green pattern mask being located at a third specific position above the base substrate, and forming a specific number of green electroluminescent sub-patterns on the base substrate by an evaporation process.

Figure 3E:
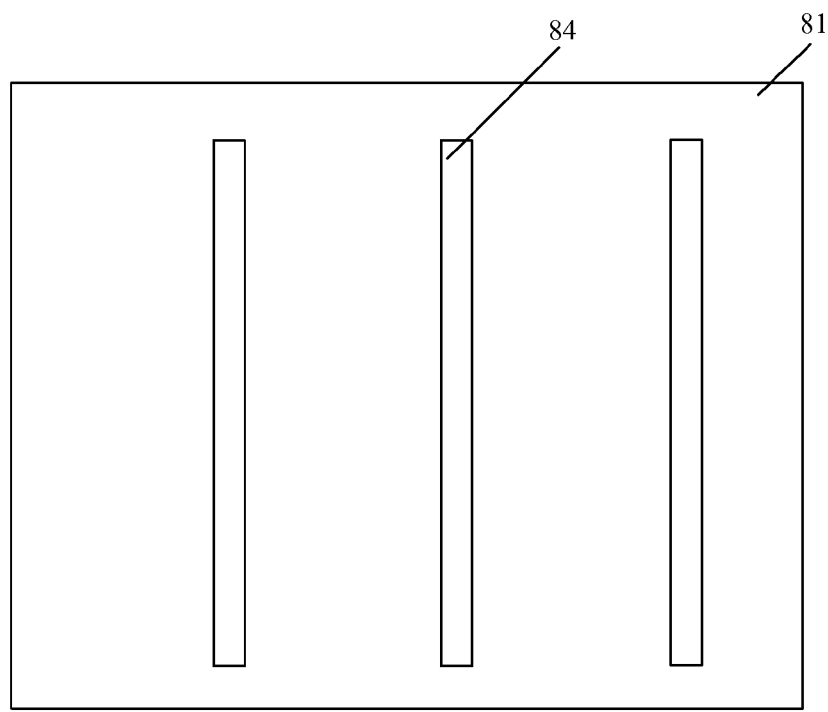
FIG. 3e is a plan view of a green pattern mask.
Figure 3F:
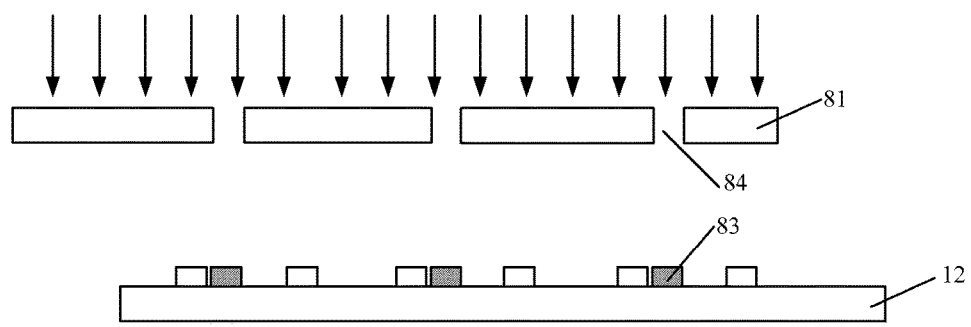
FIG. 3f is a schematic diagram illustrating a first evaporation process performed by using a green pattern mask.

FIG. 3e is a plan view of the green pattern mask, and FIG. 3f is a schematic diagram illustrating a first evaporation process performed by using the green pattern mask. As shown in FIG. 3e and FIG. 3f, a green pattern mask 81 is moved to a third specific position above the base substrate 12, and a specific number of green electroluminescent sub-patterns 83 are formed on the base substrate 12 by an evaporation process. The green pattern mask 81 is provided thereon with the specific number of opening regions 84. When the green pattern mask 81 is moved to the third specific position above the base substrate 12, the specific number of green electroluminescent sub-patterns 83 are formed. It is noted that only three opening regions 84 are present in the drawing as an example, however, those skilled in the art should understand that the actual number of the opening regions 84 is not limited thereto.

Step 204, moving the green pattern mask so that the green pattern mask being located at a fourth specific position above the base substrate, and forming a specific number of green electroluminescent sub-patterns on the base substrate by an evaporation process.

Figure 3G:
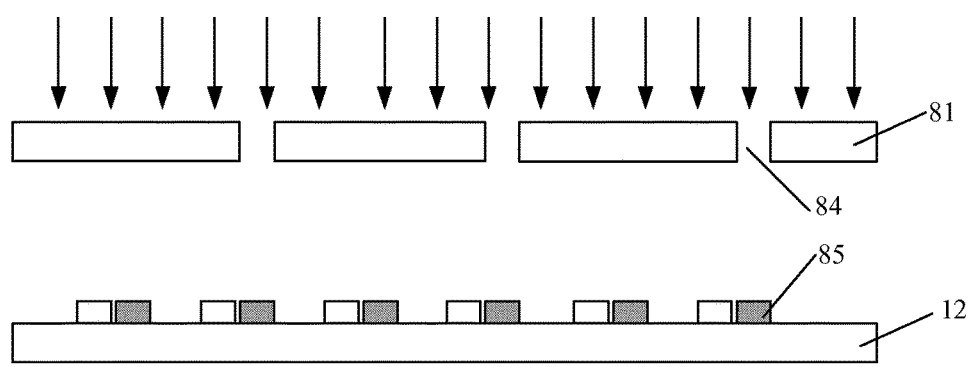
FIG. 3g is a schematic diagram illustrating a second evaporation process performed by using a green pattern mask.

FIG. 3g is a schematic diagram illustrating a second evaporation process performed by using the green pattern mask. As shown in FIG. 3e and FIG. 3g, the green pattern mask 81 is moved to a fourth specific position above the base substrate 12, and a specific number of green electroluminescent sub-patterns 85 are formed on the base substrate 12 by an evaporation process. The green pattern mask 81 is provided thereon with the specific number of opening regions 84. When the green pattern mask 81 is moved to the fourth specific position above the base substrate 12, the specific number of green electroluminescent sub-patterns 85 are formed. Of course, the third specific position in FIG. 3f is different from the fourth specific position in FIG. 3g. It is noted that only three opening regions 84 are present in the drawing as an example, however, those skilled in the art should understand that the actual number of the opening regions 84 is not limited thereto.

By performing steps 203 and 204, a green electroluminescent layer is formed on the base substrate 12, and the green electroluminescent layer includes the specific number of the green electroluminescent sub-patterns formed in step 203 and the specific number of the green electroluminescent sub-patterns formed in step 204, so that a predetermined number of the green electroluminescent sub-patterns are formed on the base substrate 12. In Embodiment 3, the predetermined number equals to the product of the specific number and the number of times of moving the green pattern mask, wherein the number of times of moving the green pattern mask (i.e. the times of masking) equals to the number of times of performing evaporation processes by using the green pattern mask. In Embodiment 3, the predetermined number equals to the specific number multiplied by two.

Step 205, moving a blue pattern mask so that the blue pattern mask being located at a fifth specific position above the base substrate, and forming a specific number of blue electroluminescent sub-patterns on the base substrate by an evaporation process.

Figure 3H:
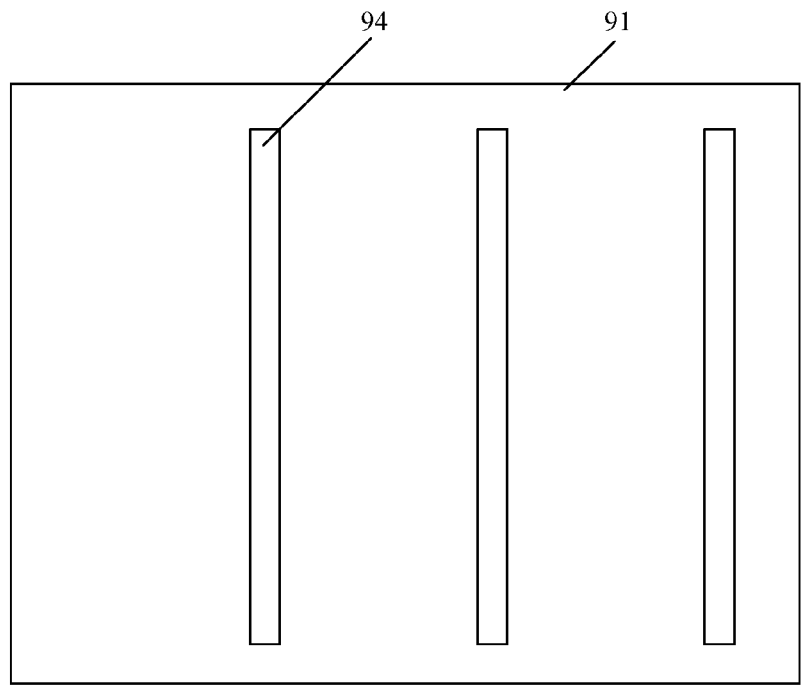
FIG. 3h is a plan view of a blue pattern mask.
Figure 3I:
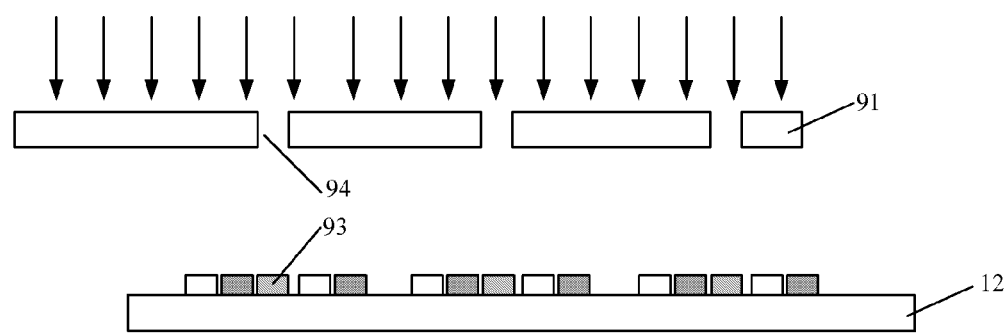
FIG. 3i is a schematic diagram illustrating a first evaporation process performed by using a blue pattern mask.

FIG. 3h is a plan view of the blue pattern mask, and FIG. 3i is a schematic diagram illustrating a first evaporation process performed by using the blue pattern mask. As shown in FIG. 3h and FIG. 3i, a blue pattern mask 91 is moved to a fifth specific position above the base substrate 12, and a specific number of blue electroluminescent sub-patterns 93 are formed on the base substrate 12 by an evaporation process. The blue pattern mask 91 is provided thereon with the specific number of opening regions 94. When the blue pattern mask 91 is moved to the fifth specific position above the base substrate 12, the specific number of blue electroluminescent sub-patterns 93 are formed. It is noted that only three opening regions 94 are present in the drawing as an example, however, those skilled in the art should understand that the actual number of the opening regions 94 is not limited thereto.

Step 206, moving the blue pattern mask so that the blue pattern mask being located at a sixth specific position above the base substrate, and forming a specific number of blue electroluminescent sub-patterns on the base substrate by an evaporation process.

Figure 3J:
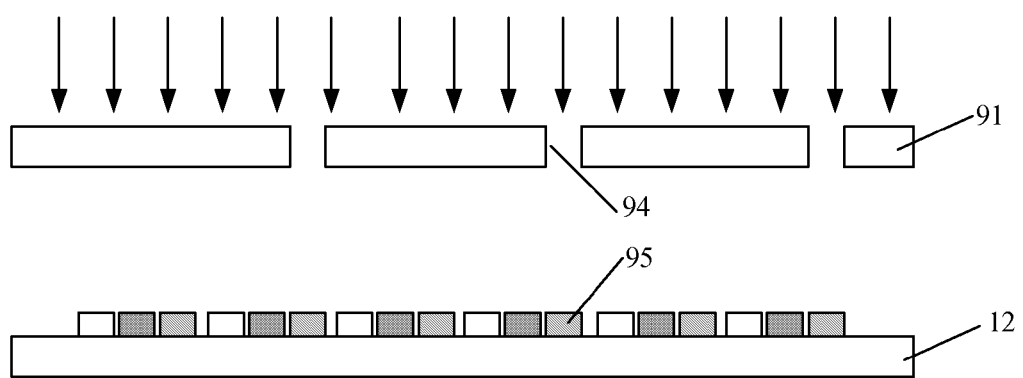
FIG. 3j is a schematic diagram illustrating a second evaporation process performed by using a blue pattern mask.

FIG. 3j is a schematic diagram illustrating a second evaporation process performed by using the blue pattern mask. As shown in FIG. 3h and FIG. 3j, the blue pattern mask 91 is moved to a sixth specific position above the base substrate 12, and a specific number of blue electroluminescent sub-patterns 95 are formed on the base substrate 12 by an evaporation process. The blue pattern mask 91 is provided thereon with the specific number of opening regions 94. When the blue pattern mask 91 is moved to the sixth specific position above the base substrate 12, the specific number of blue electroluminescent sub-patterns 95 are formed. Of course, the fifth specific position in FIG. 3i is different from the sixth specific position in FIG. 3j. It is noted that only three opening regions 94 are present in the drawing as an example, however, those skilled in the art should understand that the actual number of the opening regions 94 is not limited thereto.

By performing steps 205 and 206, a blue electroluminescent layer is formed on the base substrate 12, and the blue electroluminescent layer includes the specific number of the blue electroluminescent sub-patterns formed in step 205 and the specific number of the blue electroluminescent sub-patterns formed in step 206, so that a predetermined number of the blue electroluminescent sub-patterns are formed on the base substrate 12. In Embodiment 3, the predetermined number equals to the product of the specific number and the number of times of moving the blue pattern mask, wherein the number of times of moving the blue pattern mask (i.e. the times of masking) equals to the number of times of performing evaporation processes by using the blue pattern mask. In Embodiment 3, the predetermined number equals to the specific number multiplied by two.

Optionally, in Embodiment 3, the base substrate may also be moved so that the masks are successively located at one of different specific positions and that an evaporation pattern constituted by a predetermined number (i.e. at least one) of the evaporation sub-patterns is formed on the base substrate, and it will not be specifically described herein.

Optionally, in Embodiment 3, a red electroluminescent sub-pattern, a green electroluminescent sub-pattern and a blue electroluminescent sub-pattern may also be formed successively on a base substrate by evaporation processes performed by using only one mask. Specifically, by moving the one mask or the base substrate, a specific number of red electroluminescent sub-patterns, a specific number of green electroluminescent sub-patterns and a specific number of blue electroluminescent sub-patterns are successively formed on the base substrate, and so on, till a predetermined number of red electroluminescent sub-patterns, a predetermined number of green electroluminescent sub-patterns and a predetermined number of blue electroluminescent sub-patterns are formed on the base substrate, that is to say, a red electroluminescent layer, a green electroluminescent layer and a blue electroluminescent layer are formed on the base substrate. As the electroluminescent sub-patterns of different colors are required to be formed by using one mask, the one mask needs to be cleaned up after the electroluminescent sub-patterns of one color is formed, and then the cleaned mask is used in the process of forming the electroluminescent sub-patterns of another color.

Optionally, in above Embodiments 2 and 3 of the present invention, the processes of forming the electroluminescent sub-patterns of different colors may be implemented in different chambers or may be implemented in the same chamber. Preferably, the processes of forming the electroluminescent sub-patterns of different colors are implemented in different chambers. In a case where the processes of forming the electroluminescent sub-patterns of different colors are implemented in the same chamber, the chamber needs to be cleaned up after the electroluminescent sub-patterns of one color are formed, and then the process of forming the electroluminescent sub-patterns of another color is performed in the chamber.

Embodiment 4 of the present invention provides an evaporation device including an evaporation source and a moving device, wherein the moving device is used for successively moving a mask or a base substrate so that the mask is successively located at one of different specific positions and at least one evaporation sub-pattern is formed on the base substrate by an evaporation process, so that an evaporation pattern constituted by the at least one evaporation sub-pattern is formed on the base substrate.

The evaporation device provided by Embodiment 4 may be used to realize the evaporation method described in the above Embodiment 3, and it will not be specifically described herein.

In the technical solution of an evaporation device provided by Embodiment 4, a mask or a base substrate is successively moved by a moving device so that the mask is successively located at one of different specific positions above the base substrate and a predetermined number (i.e. at least one) of evaporation sub-patterns are formed on the base substrate, so that an evaporation pattern constituted by the predetermined number of evaporation sub-patterns is formed on the base substrate, wherein the mask is provided thereon with a specific number of opening regions, the opening regions are used for forming a specific number of evaporation sub-patterns of the predetermined number of the evaporation sub-patterns. Thus, as compared with the prior art, only a small number of opening regions are required to be formed on one mask, so that the widths of the shield regions between the adjacent opening regions may be set to be larger, that is to say, the thicknesses of the masks are not required to be thin. Further, for the present Embodiment 4, the width of the shield region between the adjacent opening regions on one mask is not equal to but more than twice as long as the pixel pitch (for example, the width thereof is five times as long as the pixel pitch). Thus, the pixel pitch can be decreased by increasing the ratio of the width of the shield region between adjacent opening regions on one mask to the pixel pitch, so that the PPI is increased correspondingly. Thus, the PPI of product will not be decreased even if a thick mask is used. Therefore, the problem of causing the PPI of product to be decreased by using a thick mask with a large number of opening regions in the prior art is avoided, so that the PPI of the product is increased and the display definition of the product is increased.

It should be understood that, the above embodiments are merely the exemplary embodiments used for explaining the principle of the present invention, but the present invention is not limited thereto. Various modifications and improvements may be made for those skilled in the art without departing from the spirit and essence of the present invention. These modifications and improvements should fall within the protection scope of the present invention.

What is claimed is:

1. An evaporation method for forming an electroluminescent layer of an organic light-emitting diode, including:
successively providing a plurality of masks for a basic color above a base substrate and forming an evaporation pattern of the basic color on the base substrate by an evaporation process, wherein the plurality of masks are each used for forming an evaporation sub-pattern of the basic color, and the evaporation pattern is constituted by the plurality of evaporation sub-patterns of the basic color formed by using the plurality of masks respectively, and wherein the basic color is a color selected from red, blue, and green.

2. The evaporation method according to claim 1, wherein the evaporation pattern includes a predetermined number of the evaporation sub-patterns, each of the plurality of masks includes a specific number of opening regions, wherein the opening regions are used for forming a specific number of the evaporation sub-patterns of the predetermined number of the evaporation sub-patterns, wherein the specific number is greater than or equal to 1.

3. The evaporation method according to claim 2, wherein the step of successively providing a plurality of masks for forming a basic color above a base substrate and forming a plurality of evaporation sub-patterns of the basic color on the base substrate by an evaporation process includes:

successively providing each of the masks above the base substrate and forming a specific number of the evaporation sub-patterns on the base substrate by an evaporation process, so that a predetermined number of evaporation sub-patterns are formed on the base substrate.

4. The evaporation method according to claim 3, wherein the predetermined number includes the product of the specific number and the number of the masks.

5. The evaporation method according to claim 4, wherein the number of the masks is two or three.

6. The evaporation method according to claim 3, wherein the number of the masks is two or three.

7. The evaporation method according to claim 3, wherein a fine metal mask is adopted as the mask.

8. The evaporation method according to claim 2, wherein the number of the at least one mask is one;

The step of successively providing at least one mask above a base substrate and forming at least one evaporation sub-pattern on the base substrate by an evaporation process includes:

successively moving a mask or the base substrate so that the mask being successively located at one of different specific positions above the base substrate and forming a specific number of the evaporation sub-patterns on the base substrate by an evaporation process, so that a predetermined number of evaporation sub-patterns are formed on the base substrate.

9. The evaporation method according to claim 8, wherein the predetermined number equals to the product of the specific number and the number of times of moving the mask or the base substrate.

10. The evaporation method according to claim 9, wherein the evaporation pattern includes an electroluminescent layer or a hole injection layer.

11. The evaporation method according to claim 8, wherein the evaporation pattern includes an electroluminescent layer or a hole injection layer.

12. The evaporation method according to claim 2, wherein a fine metal mask is adopted as the mask.

13. The evaporation method according to claim 1, wherein a fine metal mask is adopted as the mask.

* * * * *